(12) United States Patent
Takeichi (10) Patent No.: US 10,347,808 B2
(45) Date of Patent: Jul. 9, 2019

(54) LIGHT EMITTING DEVICE AND METHOD OF MANUFACTURING THE LIGHT EMITTING DEVICE

(71) Applicant: NICHIA CORPORATION, Anan-shi (JP)

(72) Inventor: Atsushi Takeichi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/252,218

(22) Filed: Aug. 31, 2016

(65) Prior Publication Data

US 2017/0062685 A1 Mar. 2, 2017

(30) Foreign Application Priority Data

Aug. 31, 2015 (JP) .................. 2015-171210

(51) Int. Cl.
*H01L 33/62* (2010.01)
*H01L 33/52* (2010.01)

(52) U.S. Cl.
CPC .............. *H01L 33/62* (2013.01); *H01L 33/52* (2013.01); *H01L 2933/0066* (2013.01)

(58) Field of Classification Search
None
See application file for complete search history.

(56) References Cited

U.S. PATENT DOCUMENTS

| 9,564,565 B2 * | 2/2017 | Nagano ................. H01L 33/486 |
| 2002/0145198 A1 | 10/2002 | Murata et al. |
| 2006/0022320 A1 | 2/2006 | Nakanishi et al. |
| 2010/0038670 A1 * | 2/2010 | Panaccione .......... G02B 6/0083 257/98 |
| 2012/0241792 A1 * | 9/2012 | Obata .................... H01L 33/62 257/98 |
| 2013/0069102 A1 | 3/2013 | Kimura et al. |
| 2013/0299864 A1 | 11/2013 | Sugizaki et al. |
| 2013/0320381 A1 | 12/2013 | Kojima et al. |
| 2015/0228872 A1 | 8/2015 | Nagano |
| 2016/0053968 A1 * | 2/2016 | Nagano .................. H01L 33/60 362/293 |

(Continued)

FOREIGN PATENT DOCUMENTS

| JP | 2000-022210 | 1/2000 |
| JP | 2001-291791 | 10/2001 |

(Continued)

*Primary Examiner* — Abul Kalam
(74) *Attorney, Agent, or Firm* — Mori & Ward, LLP (57) ABSTRACT

A method of manufacturing a light emitting device, the method includes providing a light emitting element. Each of first and second pad electrodes is provided on a second outer surface. A first conductive member is bonded to the first pad electrode and a second conductive member is bonded to the second pad electrode so that a portion of each of the first and second conductive members protrudes from a plane including a first outer surface. The light emitting element and the first and second conductive members are covered with a light-shielding member so as to expose at least a portion of the main light emitting surface. The first and second conductive members and the light-shielding member which protrude from the plane are cut off along a direction intersecting the main light emitting surface.

10 Claims, 6 Drawing Sheets

(56) References Cited

U.S. PATENT DOCUMENTS

2016/0091180 A1\* 3/2016 Nagano ................ H01L 33/486
                                                    362/293
2017/0110636 A1\* 4/2017 Park ........................ H01L 33/60

FOREIGN PATENT DOCUMENTS

| JP | 2006-041401 | 2/2006 |
| JP | 2008-258080 | 10/2008 |
| JP | 2012-146898 | 8/2012 |
| JP | 2012-204614 | 10/2012 |
| JP | 2012-212871 | 11/2012 |
| JP | 2012-227470 | 11/2012 |
| JP | 2013-069815 | 4/2013 |
| JP | 2015-111620 | 6/2015 |
| JP | 2015-153844 | 8/2015 |
| WO | WO 2002/103813 | 12/2002 |
| WO | WO 2014/154632 | 10/2014 |

\* cited by examiner

LIGHT EMITTING DEVICE AND METHOD OF MANUFACTURING THE LIGHT EMITTING DEVICE

CROSS-REFERENCE TO RELATED APPLICATIONS

The present application claims priority under 35 U.S.C. § 119 to Japanese Patent Application No. 2015-171210 filed on Aug. 31, 2015, entitled "Light emitting device and method of manufacturing the light emitting device". The contents of this application are incorporated herein by reference in their entirety.

BACKGROUND OF THE INVENTION

Technical Field

The present invention relates to a light emitting device and a method of manufacturing the light emitting device.

Discussion of the Background

Light emitting diodes (LED) have many advantageous characteristics such as low power consumption, long operational life, and high reliability, and are widely used as light emitting elements for light emitting devices such as various illuminating devices or backlight light sources. Small side-view type light emitting devices that use such LEDs such as disclosed in Japanese Unexamined Patent Application Publication No. 2012-146898 has been known.

Japanese Unexamined Patent Application Publication No. 2012-146898A discloses a side-view type light emitting device that includes a semiconductor layer, a p-side electrode an n-side electrode, a p-side wiring layer an n-side wiring layer, and an insulating layer insulating between the wiring layers, in which each wiring layer is exposed from a surface of the insulating layer that is substantially perpendicular to the light extracting surface. With this structure, a small light emitting device which can facilitate mounting to a substrate member can be obtained.

SUMMARY OF THE INVENTION

According to a first aspect of the present invention, a method of manufacturing a light emitting device, the method includes providing a light emitting element. The light emitting element includes a first outer surface, a second outer surface, and a main light emitting surface from which light is emitted. The first outer surface is connected to the second outer surface and the main light emitting surface. The light emitting element has a first pad electrode and a second pad electrode. The first pad electrode and the second pad electrode are provided on the second outer surface. The method includes bonding a first conductive member to the first pad electrode, and a second conductive member to the second pad electrode, respectively so that a portion of each of the first conductive member and the second conductive member protrudes from a plane including the first outer surface. The method includes covering the light emitting element, the first conductive member, and the second conductive member with a light-shielding member so as to expose at least a portion of the main light emitting surface. The method includes cutting off the first conductive member, the second conductive member, and the light-shielding member which protrude from the plane along a direction intersecting the main light emitting surface to provide a surface on which the first conductive member and the second conductive member are exposed.

According to a second aspect of the present invention, a method of manufacturing a light emitting device, the method includes providing a light emitting element. The light emitting element includes a first outer surface, third outer surfaces, and a main light emitting surface from which light is emitted. The third outer surfaces include one third outer surface and another third outer surface opposite to the one third outer surface. The first outer surface is connected to the main light emitting surface, the one third outer surface, the another third outer surface. The light emitting element has a first pad electrode and a second pad electrode. The first pad electrode is provided on the one third outer surface. The second pad electrode is provided on the another third outer surface. The method includes bonding a first conductive member to the first pad electrode, and a second conductive member to the second pad electrode, respectively so that a portion of each of the first conductive member and the second conductive member protrudes from a plane including the first outer surface. The method includes covering the light emitting element, the first conductive member, and the second conductive member with a light-shielding member so as to expose at least a portion of the main light emitting surface. The method includes cutting off the first conductive member, the second conductive member, and the light-shielding member which protrude from the plane along a direction intersecting the main light emitting surface to provide a surface on which the first conductive member and the second conductive member are exposed.

According to a third aspect of the present invention, a method of manufacturing a light emitting device, the method includes providing a light emitting element. The light emitting element includes a first outer surface, a second outer surface, a third outer surface, and a main light emitting surface from which light is emitted. The first outer surface is connected to the second outer surface, the third outer surface, and the main light emitting surface. The light emitting element has a first pad electrode and a second pad electrode. The first pad electrode is provided on the second outer surface or the third outer surface. The second pad electrode is provided on the second outer surface or the third outer surface. A first conductive member is bonded to the first pad electrode and a second conductive member is bonded to the second pad electrode, respectively so that a portion of each of the first conductive member and the second conductive member protrudes from a plane including the first outer surface. The light emitting element, the first conductive member, and the second conductive member are covered with a light-shielding member so as to expose at least a portion of the main light emitting surface. The first conductive member, the second conductive member, and the light-shielding member which protrude from the plane are cut off along a direction intersecting the main light emitting surface to provide a surface on which the first conductive member and the second conductive member are exposed.

According to a fourth aspect of the present invention, a light emitting device includes a light emitting element, a first conductive member, a second conductive member, and a light-shielding member. The light emitting element includes a first outer surface, a second outer surface, and a main light emitting surface from which light is emitted. The first outer surface is connected to the second outer surface and the main light emitting surface. The light emitting element includes a first pad electrode and a second pad electrode. The first pad electrode and the second pad electrode are provided on the second outer surface. A center of each of the first pad electrode and the second pad electrode is disposed on a first outer surface side of a surface connected to the first outer surface. The first conductive member includes a first core and a first adhesive layer which bonds the first core and the first pad electrode. The second conductive member includes a second core and a second adhesive layer which bonds the second core and the second pad electrode. The light-shielding member covers the light emitting element, the first conductive member, and the second conductive member so as to expose at least a portion of the main light emitting surface and to expose each of the first core and the second core on a surface connected to a surface where the main light emitting surface is exposed.

According to a fifth aspect of the present invention, a light emitting device includes a light emitting element, a first conductive member, a second conductive member, and a light-shielding member. The light emitting element includes a first outer surface, third outer surfaces, and a main light emitting surface from which light is emitted. The third outer surfaces include one third outer surface and another third outer surface opposite to the one third outer surface. The first outer surface is connected to the main light emitting surface, the one third outer surface, and the another third outer surface. The light emitting element includes a first pad electrode and a second pad electrode. The first pad electrode is provided on the one third outer surface. The second pad electrode is provided on the another third outer surface. A center of each of the first pad electrode and the second pad electrode is disposed on a first outer surface side of a surface connected to the first outer surface. The first conductive member includes a first core and a first adhesive layer which bonds the first core and the first pad electrode. The second conductive member includes a second core and a second adhesive layer which bonds the second core and the second pad electrode. The light-shielding member covers the light emitting element, the first conductive member, and the second conductive member so as to expose at least a portion of the main light emitting surface and to expose each of the first core and the second core on a surface connected to a surface where the main light emitting surface is exposed.

According to a sixth aspect of the present invention, a light emitting device includes a light emitting element, a first conductive member, a second conductive member, and a light-shielding member. The light emitting element includes a first outer surface, a second outer surface, a third outer surface, and a main light emitting surface from which light is emitted. The first outer surface is connected to the second outer surface, the third outer surface, and the main light emitting surface. The light emitting element has a first pad electrode and a second pad electrode. The first pad electrode is provided on the second outer surface or the third outer surface. The second pad electrode is provided on the second outer surface or the third outer surface. A center of each of the first pad electrode and the second pad electrode is disposed on a first outer surface side of a surface connected to the first outer surface. The first conductive member includes a first core and a first adhesive layer which bonds the first core and the first pad electrode. The second conductive member including a second core and a second adhesive layer which bonds the second core and the second pad electrode. The light-shielding member covers the light emitting element, the first conductive member, and the second conductive member so as to expose at least a portion of the main light emitting surface and to expose each of the first core and the second core on a surface connected to a surface where the main light emitting surface is exposed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings. The light emitting device and the method of manufacturing the light emitting device described below are intended to give a concrete form to technical ideas of embodiments, and the scope of the invention is not limited to those described below. In particular, the sizes, materials, shapes, the relative positions and the like of the members are not given as a limitation to the technical scope of the present invention, and are occasionally shown exaggerated for ease of explanation. Each configuration in embodiments and examples described below can be applied in an appropriate combination.

First Embodiment

Method of Manufacturing Light Emitting Device

In a method of manufacturing a light emitting device according to a first embodiment, first, a light emitting element having a first surface and a plurality of surfaces connected to the first surface, in which any one surface of the plurality of surfaces connected to the first surface is a main light emitting surface, the light emitting element also having a pair of pad electrodes arranged on any one surface of the plurality of surfaces other than the main light emitting surface is provided. Next, spherical conductive members that are provided beforehand are bonded on the pair of the electrodes respectively so that a portion of each of the conductive members protrudes from the plane that includes the first surface of the light emitting element. Subsequently, the light emitting element and the conductive members are covered by a light-shielding member so as to expose at least a portion of the main light emitting surface. Then, at least a portion of the conductive members protruding from the plane that includes the first surface and a portion of the light-shielding member covering the protruding portion of the conductive members are cut in a direction intersecting the main light emitting surface, which allows for exposing the conductive members in the mounting surface of the light emitting device. Accordingly, a side-view type light emitting device with a chip-size package (CSP) having a mounting surface connected to the main light emitting surface can be obtained. Each step in a method of manufacturing a light emitting device according to the first embodiment will be described in detail below.

Providing Light Emitting Element

Figure 1:
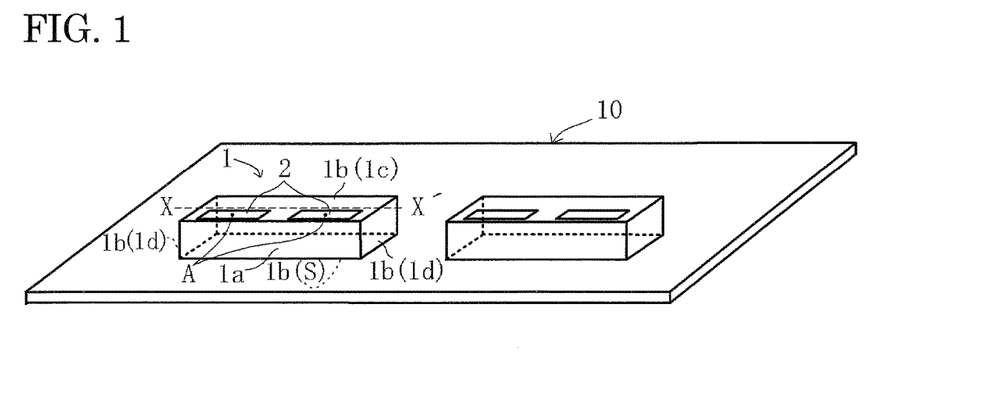
FIG. 1 is a schematic perspective view illustrating a step of providing a light emitting element in a method of manufacturing a light emitting device according to a first embodiment.

FIG. 1 is a schematic perspective view illustrating a step of providing a light emitting element in a method of manufacturing a light emitting device according to the first embodiment. In the step of providing light emitting element, either one or a plurality of the light emitting elements 1 each having at least a first surface 1a, and a plurality of surfaces 1b connected to the first surface 1a may be provided. Of the plurality of surfaces 1b connected to the first surface 1a, any one surface serves as a main light emitting surface S, and any one surface of the plurality of surfaces 1b other than the main light emitting surface S serves as a surface on which a pair of positive and negative pad electrodes 2 are arranged. The term "(a surface) connected to the first surface 1a" refers to (a surface) connecting to the first surface 1a so as to be inclined or substantially perpendicular with respect to the first surface 1a, and more specifically refers to a surface 1b and the first surface 1a are at an angle of any one of an acute angle, 90°, and an obtuse angle.

In the first embodiment, for example, the light emitting element 1 that has a substantially rectangular-parallelepiped shape with a plurality of surfaces 1b substantially perpendicularly connected to the first surface 1a, and a pair of pad electrodes 2 arranged on a second surface 1c, which is opposite side to the main light emitting surface S can be provided. As described above, in the case where the light emitting element 1 has the pair of pad electrodes 2 on a same surface thereof, each of the conductive members 3 can be easily bonded on each of the pad electrodes 2, and thus is preferable. Also, with the pad electrodes 2 arranged on the second surface 1c opposite to the main light emitting surface S, for example, in the case where the light emitting element 1 has a substantially rectangular-parallelepiped shape in which a surface having a relatively wider area is a main light emitting surface S, a relatively large surface can be provided for placing the pad electrodes 2 next to each other, which facilitates arrangement of the conductive members 3 on the pad electrodes 2, and thus is preferable. Note that, of the plurality of surfaces 1b that are connected to the first surface 1a, a surface also connected to the main light emitting surface S is referred to as a third surface 1d. In the first embodiment, two surfaces each being substantially perpendicular to both the first surface 1a and the main light emitting surface S are the third surfaces 1d.

In the first embodiment, in a plan view, the pad electrodes 2 are preferably disposed on a second surface 1c with the center A of each of the pad electrodes 2 on a first surface 1a side. The expression "with the center of each of pad electrodes 2 on a first surface 1a side" refers to that the center of each of pad electrodes 2 is closer to the first surface 1a than to the center of the surface on which the pad electrodes 2 are arranged. In other words, pad electrodes 2 are respectively arranged so as to have a wider area on the first surface 1a side. The expression "arranged so as to have a wider area on the first surface 1a side" refers to an arrangement in which each pad electrode 2 is located with a larger area in a region at the first surface 1a side than in a region at the opposite side with respect to a center line X-X' that connects the center of both short sides of the surface where each pad electrode 2 is disposed. That is, in the first embodiment, as illustrated in FIG. 1, each pad electrode 2 is located with a larger area in a region at the first surface 1a side than in a region at the opposite side with respect to a center line X-X' that connects the center of both sides of the light emitting element 1 in a direction substantially perpendicular to the first surface 1a, that is, a center line X-X' that connects both short sides of the surface of the light emitting element 1 where each pad electrode 2 is disposed. With this arrangement, in a step of bonding conductive members to be performed later, the conductive members can be easily bonded to the pad electrodes 2 so as to protrude from the plane that includes the first surface 1a. This will be described in more detail in the step of bonding the conductive members below.

In the first embodiment, a planar shape of each of the pad electrodes 2 can be a rectangular shape, for example. Also, any appropriate suitable shape, for example, a polygonal shape such as a triangular shape, a trapezoidal shape, or a hexagonal shape, a circular shape, or an elliptical shape can be selected for the planar shape of the pad electrodes 2. A configuration in which the pad electrode 2 has a shape different from that in the first embodiment will be described in detail in a third embodiment below.

The light emitting elements 1 thus provided may be arranged on a sheet 10. For example, as shown in FIG. 1. The light emitting elements 1 are arranged so that the main light emitting surfaces S are in contact with the sheet 10 and the surfaces having the pad electrodes 2 are facing upward. Such arrangement of the light emitting elements 1 with the pad electrodes 2 facing upward can facilitate arrangement of the conductive members on the pad electrodes 2 in a step of connecting the conductive members to be performed later. With this arrangement, the light-shielding member can be formed without covering the main light emitting surfaces S of the light emitting elements 1 in a step of forming the light-shielding member. The sheet 10 preferably has an adhesiveness strong enough to hold the light emitting elements 1 on a surface thereof, and examples of materials thereof include PVC and Kapton®. A non-adhesive sheet 10 may also be used, and in such a case, each of the light emitting elements 1 may be held on the sheet 10 with the use of an adhesive agent. The sheet 10 may be removed in a later step, or may be used as a part of each of the light emitting devices. In the case of using the sheet 10 as a part of each of the light emitting devices, a light-transmissive sheet 10 is preferably used. For example, a wavelength converting material may be contained in a light-transmissive sheet 10 and the light emitting elements 1 are arranged thereon. Thus, the light-transmissive sheet 10 containing a wavelength converting material can be used as a wavelength converting layer of the light emitting devices.

Bonding Conductive Members

Figure 2A:
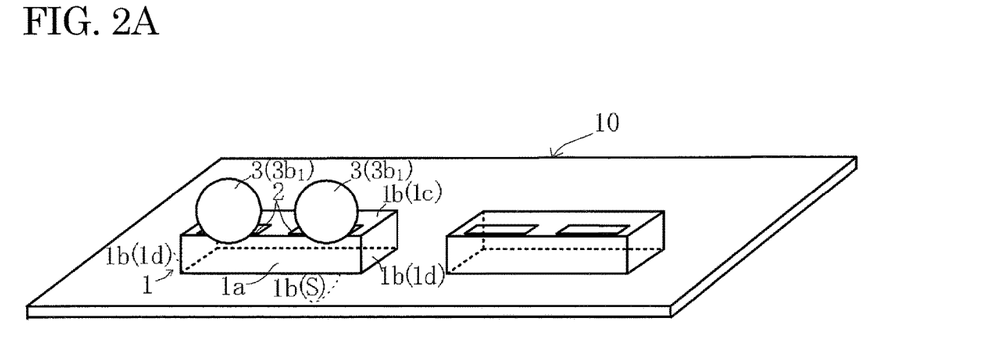
FIG. 2A is a schematic perspective view illustrating a step of bonding conductive members in a method of manufacturing a light emitting device according to the first embodiment.

FIG. 2A is a schematic perspective view illustrating a step of bonding conductive members in a method of manufacturing a light emitting device according to the first embodiment. In the step of bonding conductive members, spherical conductive members 3 that are provided are respectively arranged on each of the pad electrodes 2 of the light emitting element 1, and bonded. The conductive members 3 are bonded to the pad electrodes 2 so that a portion of each of the conductive members 3 protrudes from the plane that includes the first surface 1a.

Figure 2B:
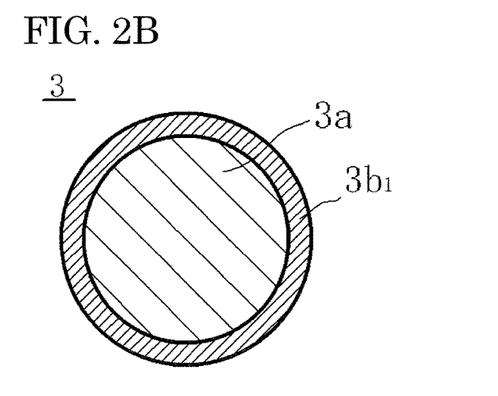
FIG. 2B is a schematic cross-sectional view of each of conductive members according to the first embodiment.

FIG. 2B is a schematic cross-sectional view of one of the conductive members 3 according to the first embodiment. Each of the conductive members 3 provided in the step of bonding the conductive members has a spherical shape, and is made of a conductive material so that electrical connection to the pad electrodes 2 can be obtained. In particular, it is preferable to use the spherical conductive members 3 each including a core 3a and an adhesive layer $3b_1$ that covers the core 3a and has a melting point lower than that of the core 3a, which can be easily bonded to the pad electrodes 2 by heating. In the first embodiment, the spherical conductive members 3 each having a core 3a made of a metal such as Cu and an adhesive layer $3b_1$ such as a solder covering the core 3a can be used. In the specification, the terms "spherical conductive member(s)" and "conductive members each having a spherical shape" refer in addition to conductive members each having a shape of a complete sphere, also to conductive members each having, for example, an elliptic cross-sectional shape or having an irregular surface.

The conductive members 3 can be temporarily arranged (temporarily fixed) on the pad electrodes 2 using a flux or the like. The flux is disposed on the pad electrodes 2 by using a desired method such as printing, pin-transferring, or dispensing. In the case of removing the flux, the flux is removed between performing reflow operation and before forming the light-shielding member. In the temporarily arranging, with the use of the spherical conductive members 3, a plurality of conductive members 3 can be placed (temporarily fixed) efficiently on the pad electrodes 2 (i.e., on the flux) by using a transferring method. The transferring method is, for example, a method of arranging the conductive members 3 on respective corresponding positions of the pad electrodes 2, in which a base formed with holes greater than the diameter of the conductive members 3 at portions corresponding to the pad electrodes 2 of the light emitting elements 1 arranged on the sheet 10 is provided, the base is set so that the holes locate over the corresponding pad electrodes 2, the plurality of the conductive members 3 are placed on the base, and then the base is shaken so that the conductive members 3 enter the holes and are transferred onto predetermined positions on the corresponding pad electrodes 2. Otherwise, the conductive members 3 can be arranged on the pad electrodes 2 by using a pick-up method. The arrangement of the conductive members 3 may also be such that the cores 3a having a spherical shape are provided, an adhesive layer is arranged beforehand on each of the pad electrodes 2, and the cores 3a are arranged on the adhesive layer of the pad electrodes 2.

Figure 2C:
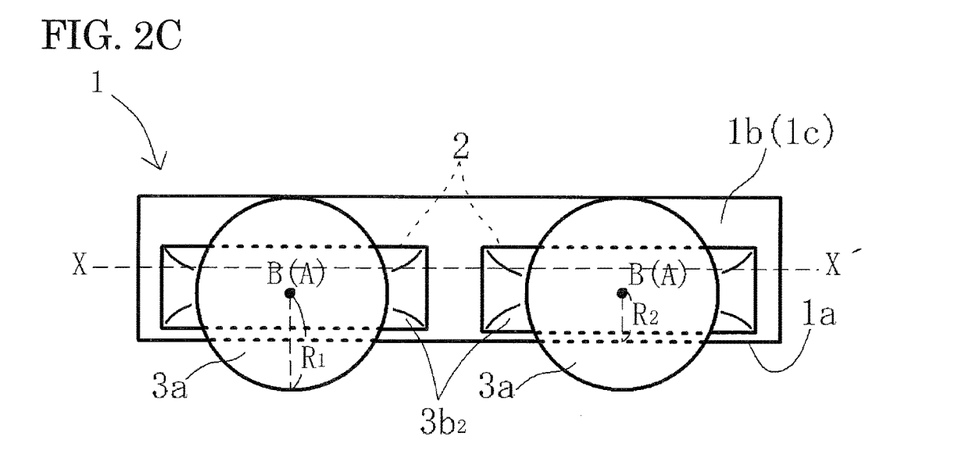
FIG. 2C is a schematic plan view illustrating a step of bonding conductive members in a method of manufacturing a light emitting device according to the first embodiment.

FIG. 2C is a schematic plan view illustrating a step of bonding conductive members in a method of manufacturing a light emitting device according to the first embodiment. In the first embodiment, the conductive members 3 arranged on the pad electrodes 2 as shown in FIG. 2A are heated at a temperature greater than a melting point of the adhesive layer $3b_1$. With this heating, the pad electrodes 2 and the conductive members 3 are bonded as illustrated in FIG. 2C. In detail, in the first embodiment, with a bonding layer $3b_2$ such as solder melted by heating, the pad electrodes 2 and cores 3a such as Cu are bonded. At this time, in the first embodiment, the solder, which is the adhesive layer $3b_2$, wet-spreads on the pad electrodes 2 made of metals or the like. This causes self-aligning of the cores, so that the pad electrodes 2 and the conductive members 3 are bonded with the center A of each of the pad electrodes 2 overlapping the center B of each of the cores 3a. With the self-alignment effect, the pad electrodes 2 and the conductive layers 3 (cores 3a) can be bonded easily with good positioning accuracy. In this case, as shown in FIG. 2C, the radius $R_1$ of the core 3a is preferably approximately equal to or greater than the minimum distance $R_2$ between the center A of the pad electrode 2 to the plane that includes the first surface 1a. With this arrangement, the conductive members 3 can be easily bonded to the pad electrodes 2 with a portion of the conductive members 3 protruding from the plane that includes the first surface 1a. It is more preferable to use the cores 3a that have a radius R1 greater than the length from the center A of the pad electrode 2 to an edge of the first surface 1a side of the light-shielding member to be cut in a step of singulating performed later. Accordingly, the conductive members 3 (cores 3a) can be surely exposed at the cutting surface, which is to be the bonding surface of the respective light emitting devices.

As described above, in the case of using the conductive members 3 having a structure that allows self-alignment with respect to the pad electrodes 2, the portion of each of the conductive members 3 may not protrude out from the plane that includes the first surface 1a at the time of arranging the conductive members 3 on the pad electrodes 2. That is, on the surface where the pad electrodes 2 are arranged, the conductive members 3 are not necessarily arranged to be closer to the first surface 1a side. For example, in the first embodiment, the conductive members 3 (cores 3a) can be bonded to the pad electrodes 2 so as to protrude out from the plane that includes the first surface 1a, by arranging the conductive members 3 near the center line X-X' where the conductive members 3 can be arranged relatively stably, and then applying heat so that the center B of each of the conductive members 3 moves to overlap the center A of corresponding pad electrode 2. Accordingly, even in the case of using a light emitting element 1 having a relatively-narrow width, the conductive members 3 can be bonded more easily without falling off from the light emitting element 1.

In Embodiment 1, the pad electrodes 2 and the conductive members 3 (cores 3a) can be bonded so that the conductive members 3 (cores 3a) protrudes out from the plane that includes the first surface 1a by 50 μm or greater, more preferably by about 60 μm. With this arrangement, the conductive members 3 (cores 3a) can be sufficiently exposed on the mounting surface of the light emitting device.

Forming Sealing Member

Figure 3A:
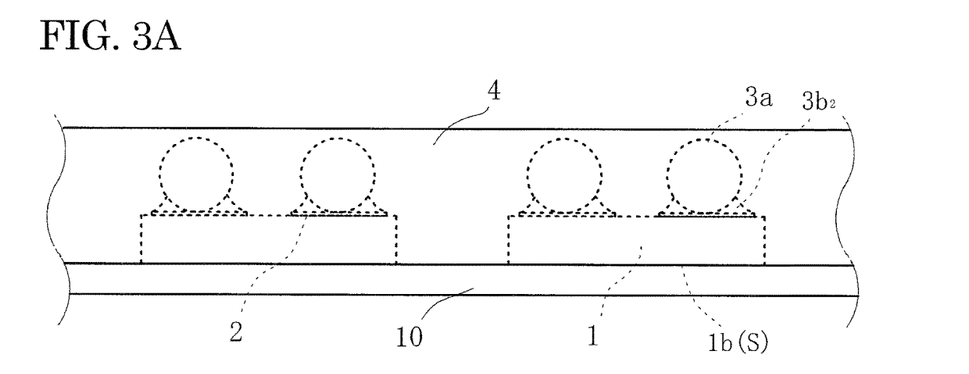
FIG. 3A is a schematic lateral view illustrating a step of forming a light-shielding member in a method of manufacturing a light emitting device according to the first embodiment.
Figure 3B:
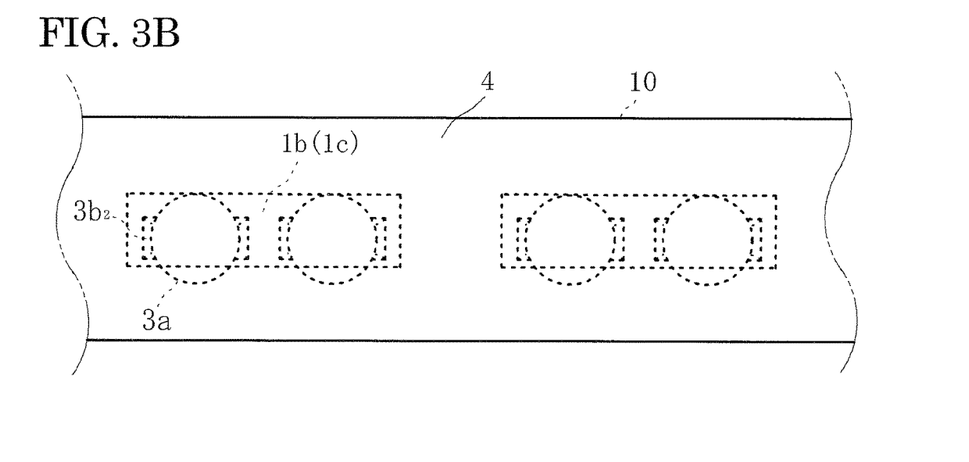
FIG. 3B is a schematic plan view of FIG. 3A.

FIG. 3A is a schematic lateral view illustrating a step of forming a light-shielding member in a method of manufacturing a light emitting device according to the first embodiment. FIG. 3B is a schematic plan view of FIG. 3A. In the step of forming the light-shielding member, the light emitting element 1 and the spherical conductive members 3 bonded to the light emitting element 1 are covered by the light-shielding member 4 so that the main light emitting surface S of the light emitting element is exposed. In detail, in the first embodiment, the light-shielding member 4 can be formed so as to cover the first surface 1a, the surface opposite to the first surface 1a, the surface on which the pad electrodes 2 are formed (i.e., the second surface 1c), the third surface 1d, and the conductive members 3. A portion of upper surface sides of the light-shielding member 4 and the conductive members 3 (cores 3a) shown in FIG. 3A may be removed to expose a portion of the conductive members 3 (cores 3a) from a surface of the light-shielding member 4. With this arrangement, the conductive members 3 (cores 3a) can also be exposed from the back surface of the light emitting device 100, which allows formation of the light emitting device 100 that can be mounted stably on a mounting substrate.

The light-shielding member 4 is configured to shield light emitted from the light emitting element 1, and for example, made of a material that includes a light-reflecting material contained in a resin as a base material. The light-shielding member 4 can be formed by injection molding, transfer molding, extrusion molding, printing, coating, or the like.

Singulating

Figure 4A:
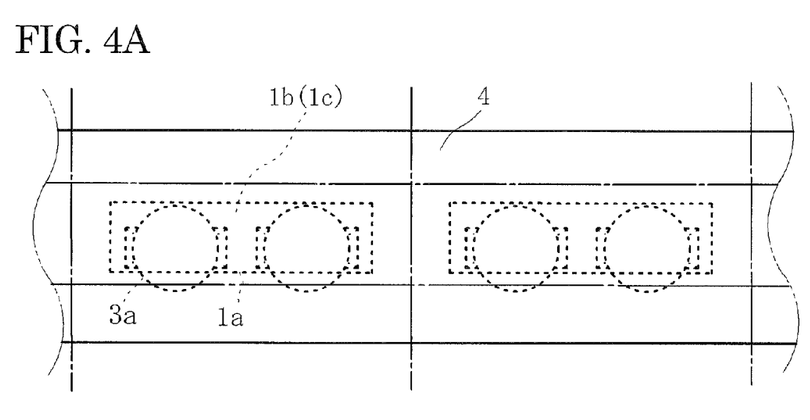
FIG. 4A is a schematic plan view illustrating portions to be cut in a step of singulating in a method of manufacturing a light emitting device according to the first embodiment.
Figure 4B:
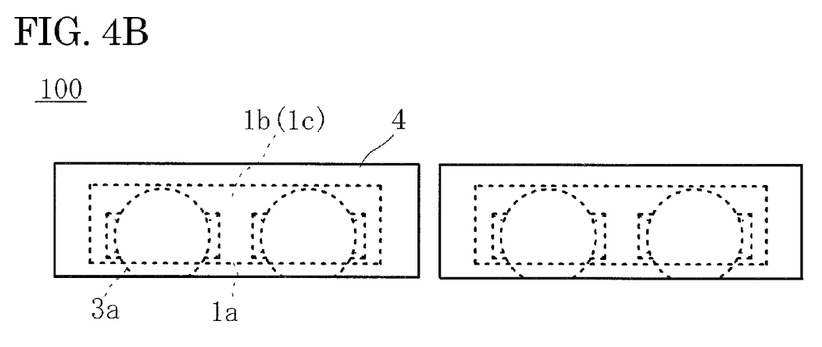
FIG. 4B is a schematic plan view illustrating a step of singulating in a method of manufacturing a light emitting device according to the first embodiment.

FIG. 4A is a schematic plan view illustrating portions to be cut in a step of singulating in a method of manufacturing a light emitting device according to the first embodiment. FIG. 4B is a schematic plan view illustrating a step of singulating in a method of manufacturing a light emitting device according to the first embodiment. In the step of singulating, respective portions of the light-shielding member 4 and the conductive members 3 (cores 3a) are cut by dicing or the like, to obtain individual light emitting devices 100. In the case of removing the sheet 10, the sheet is preferably removed before the step of singulating.

More specifically, at least portions of the pair of the conductive members 3 (core 3a) protruded out from the plane that includes the first surface 1a and a portion of the light-shielding member covering the conductive members are cut in a direction intersecting with the main light emitting surface, so that the mounting surface of the light emitting device that is connected to the main light emitting surface S and on which the pair of conductive members 3 (core 3a) are exposed is made. In Embodiment 1, as shown by the alternate long and short dashed line in FIG. 4A, the pair of the conductive members 3 (cores 3a) and the light-shielding member 4 covering the conductive members 3 are cut in a direction that is substantially perpendicular to the main light emitting surface S and is parallel to the first surface 1a. Further, the light-shielding member 4 can be cut substantially perpendicular with respect to the main light emitting surface S along with (substantially in parallel with) each of a surface of the light emitting element 1 connected to the main light emitting surface S, i.e., a surface opposing the first surface 1a and the third surface 1d. With this cutting, as illustrated in FIG. 4B, the light emitting device 100 having the mounting surface that is substantially perpendicular to the main light emitting surface S and in which the pair of the conductive members 3 (cores 3a) are exposed.

Other Steps

In addition to the steps described above, for example, a step of forming wavelength converting layer, a step of forming light-transmissive layer, or a step of forming terminal-covering films may be appropriately performed.

The step of forming wavelength converting layer is a step in which a wavelength converting member 5 to convert light emitted from the main light emitting surface S into light having desired wavelength is formed on the main light emitting surface 5. For the wavelength converting layer 5, a member in which a base material such as a resin or a glass that contains a wavelength converting material such as a phosphor can be employed. The wavelength converting layer 5 can be formed by using a desired method such as spraying, printing, coating, or attaching. As described above, for example, a light transmissive resin or the like that contains a wavelength converting material is used, and the sheet 10 is cut together with the conductive members 3 and the light-shielding member 4 in the step of singulating. Thus, the wavelength converting layer 5 can be obtained.

The step of forming the light-transmissive layer is a step in which a light-transmissive layer 6 having light-transmissive property is formed on a light emitting surface (more specifically, on the wavelength converting layer 5 or on the main light emitting surface S) of the light emitting device. With the light-transmissive layer 6, the light emitting surface can be protected. For example, for example, a light-transmissive resin or a glass can be used as the light-transmissive member 6. Further, inclusion of a filler or the like in the light-transmissive layer 6 allows for improving light extraction efficiency and reducing tackiness. The light-transmissive layer 6 can be formed by using a desired method such as spraying, printing, coating, or attaching. The step of forming the wavelength converting layer and the step of forming the light-transmissive layer are preferably performed before performing the step of singulating.

In the step of forming the terminal-covering films, terminal-covering films 7 is formed to protect portions of the conductive members 3 (cores 3a) on the mounting surface of the light emitting device that are exposed in the step of singulating, that is, to protect terminals of the light emitting device. For the terminal-covering films 7, gold, silver, nickel, aluminum, rhodium, copper or alloys of those can be used. The terminal-covering films 7 can be formed by plating, sputtering or the like. In particular, after integrally forming a covering film on the light-shielding member 4 and the conductive members 3 (core 3a) on the mounting surface by sputtering or the like, an entirety of the mounting surface is irradiated with laser. Thus, only a portion of the covering member arranged on the light-shielding member 4 can be removed, so that the terminal-covering film 7 can be efficiently formed. By the irradiation of the laser, the mounting surface is roughened, which can increase strength of the bonding with the mounting substrate. Also, roughness of the mounting surface allows for reducing tackiness of the light emitting device.

As described above, forming the wirings (i.e., terminals) of the light emitting device with the spherical conductive members 3 provided in advance can reduce time and cost of manufacturing compared with the case of forming the wirings (terminals) by plating or the like. Also, with the use of the spherical conductive members 3 each having a desired radius in which the core 3a such as Cu is covered by the adhesive layer $3b_1$, disposing the pad electrodes 2 in a region closer to the first surface 1a (i.e., the mounting surface) allows the conductive members 3 (cores 3a) to be surely exposed on the mounting surface as the terminals.

Light Emitting Device 100

Figure 5:
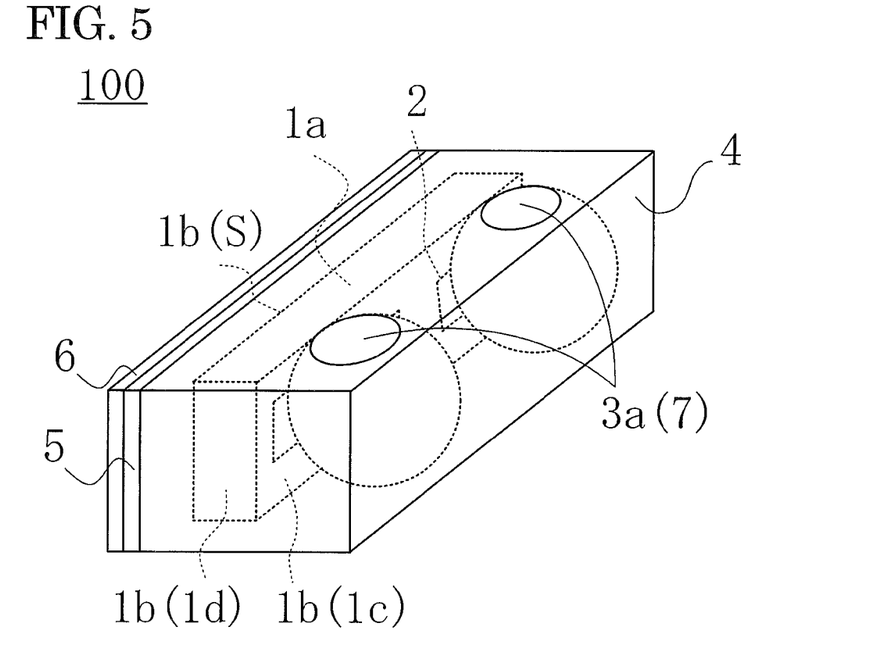
FIG. 5 is a schematic perspective view illustrating a light emitting device according to the first embodiment, in which a mounting surface side is an upper side.

FIG. 5 is a schematic perspective view illustrating a light emitting device 100 according to the first embodiment, in which a mounting surface side is the upper side in the figure. In FIG. 5, the adhesive layer $3b_2$ that bonds the cores 3a and the pad electrodes 2 is not shown for the sake of easy understanding. In a similar manner, the adhesive layer is also not shown in each of FIG. 6B, FIG. 7, FIG. 8A, FIG. 8B. The light emitting device 100 formed by steps described above includes the light emitting element 1 having the first surface 1a and the plurality of surfaces 1b. In the light emitting element 1, any one surface of the plurality of surfaces 1b connected to the first surface 1a is the main light emitting surface S, and the pair of pad electrodes 2 is arranged on any one surface of the plurality of surfaces 1b other than the main light emitting surface S. In the first embodiment, the pair of pad electrodes 2 is arranged on the second surface 1c, which is one surface of the surfaces 1b opposing the main light emitting surface S. The center of each of the pair of pad electrodes 2 is disposed on the first surface 1a side.

Also, the light emitting device 100 according to the first embodiment includes the conductive members 3 each including a substantially-spherical core 3a bonded to each of the pair of the pad electrodes 2 of the light emitting element 1 and the adhesive layers $3b_2$ bonding the cores 3a and the pad electrodes 2. The pair of conductive members 3 is bonded to the pad electrodes 2 so that a portion of each of the conductive members 3 protrudes from a plane that includes the first surface 1a.

The light-shielding member 4 forms outer surfaces of the light emitting device 100, and covers the light emitting element 1 and a portion of each of the conductive members 3. More specifically, the light-shielding member 4 covers the light emitting element 1 and the conductive members 3 so that at least a portion of the main light emitting surface S is exposed, and a portion of each of the cores 3a is exposed on a surface connected to a surface where the main light emitting surface is exposed. In the first embodiment, the surface (i.e., the mounting surface) of the light emitting device 100 where a portion of each of the cores 3a is exposed from the light-shielding member 4 is one of the surfaces connected to the surface exposing the main light emitting surface S and above the first surface 1a toward which the pad electrodes 2 are arranged offset on the second surface 1c. The light-shielding member 4 serves to reflect light emitted from the light emitting element 1 to a main light emitting surface S side.

In the light emitting device 100 according to the first embodiment, as illustrated in FIG. 5, when assuming the main light emitting surface S side as the front surface of the light emitting device 100, an outer surface of the light-shielding member 4 of a second surface 1c side is the back surface of the light emitting device 100. Similarly, an outer surface of the light-shielding member 4 on a first surface 1a side and substantially perpendicularly connected to the front surface and the back surface is the mounting surface of the light emitting element 100. Further, an outer surface of the light-shielding member 4 on the third surface 1d side that is substantially perpendicularly connected to the front surface, the back surface, and the mounting surface is a lateral surface of the light emitting element 100. The light emitting device 100 according to the first embodiment can be a side-view type light emitting device 100 in which, a portion of each of the conductive members 3 (cores 3a) is exposed from the mounting surface to serve as an external terminal. With the configuration in which the cores 3a are exposed only on the mounting surface, the light emitting device 100 can be made less easily fall down backward. In the first embodiment, each of the cores 3a is exposed in a circular shape in the mounting surface, but other appropriate form of exposure can be employed. Each of the cores 3a may be exposed to have a shape of an incomplete circle such as a semi-circle or a fan shape by adjusting the size or the portion to be cut of each of the conductive members. Also, in the case where each of the cores 3a is exposed on a plurality of surfaces of the light emitting device 100, the core 3a may be exposed continuously in the plurality of surfaces, or may be exposed separately in the plurality of the surfaces.

The core 3a of the light emitting device 100 has a mostly spherical shape. In the present specification, the term "mostly spherical shape" includes, in addition to a complete sphere, a spherical shape having an elliptic cross-section or an irregular surface. The term "mostly spherical shape" also includes a shape of a spherical segment of one base (or a spherical cap), which is a portion of a sphere cut off by a plane. The term "mostly spherical shape" refers to a shape in which a portion of a sphere is removed. This term also refers to, when a sphere intersects with a plane, a shape of either side of the sphere with respect to the plane, that is, a shape formed by a spherical crown and a cross-sectional plane. The core 3a having a mostly spherical shape can be formed by, for example as described above, using the conductive members 3 each including the spherical core 3a and the adhesive layer $3b_1$, bonding each of the pad electrodes 2 and the cores 3a by the adhesive layer $3b_2$ and cutting a portion of the light-shielding member 4 with a portion of each of the cores 3a in the step of singulating, as described above. Accordingly, in the case of using the core 3a having a mostly spherical shape, a portion of the mostly spherical shape corresponding to the cross-sectional plane is exposed on the mounting surface (i.e., the light-shielding member 4) as the terminals.

As described above, for example, in the case of using the conductive members 3 in which the cores 3a such as Cu are respectively covered by the adhesive layer 3b1, the conductive members 3 are bonded to the pad electrodes 2 so that the center B of each of the core 3a overlaps the center A of each of the pad electrodes 2 due to self-alignment effect. Accordingly, the cores 3a each having a shape of a mostly spherical shape are respectively bonded to the pad electrodes 2 so that a portion of each of the cores 3a corresponding to the center of the original sphere of the mostly spherical shape overlaps the center of each of the pad electrodes 2.

With the configuration as described above, the light emitting device 100 can be obtained by less manufacturing time and cost compared with the case of forming the conductive members by plating or the like. Also, a small-size side-view type light emitting device 100 in which each of the conductive members 3 (cores 3a) can be surely exposed on the mounting surface.

Compositional members of the light emitting device 100 is described in detail below.

Light Emitting Element

For the light emitting element 1, a light emitting element such as a light emitting diode or a laser diode that are generally used in the art can be used. For example, various semiconductors such as nitride-based semiconductors ($In_XAl_YGa_{1-X-Y}N$, $0 \leq X$, $0 \leq Y$, $X+Y \leq 1$), Group III-V compound semiconductors such as GaP or GaAs, ZnSe, or Group II-VI compound semiconductors can be used for the light emitting element 1. The light emitting element 1 includes, at least, semiconductor layers including a light emitting layer, a pair of positive and negative electrodes, and a pair of positive and negative pad electrodes 2 respectively connected to the electrodes. The pad electrodes 2 may be a plurality of pairs of pad electrodes 2. Examples of a material for the pad electrodes 2 include metals such as Au, Ag, Cu, Pt, Al, Rh, W, Ti, Ni, and Pd. These metals can be used as a single layer or a stacked multilayer structure. The pad electrodes 2 are preferably arranged so that, on the surface of the light emitting element 1 on which the pad electrodes 2 are to be arranged, the center A of each of pad electrodes 2 is closer to the first surface 1a by 5 μm to 50 μm with respect to the center line X-X'.

The semiconductor light emitting element 1 may include a substrate used for growing the semiconductor layers. Examples of the substrate include an insulating substrate made of such as sapphire, SiC, ZnO, Si, GaAs, and diamond, and an oxide substrate made of such as lithium niobate and neodymium gallate. In particular, the substrate is preferably light-transmissive. The substrate may be removed by using laser lift-off method or the like. The planar shape of the light emitting element 1 may have a quadrangle shape, and may also have other appropriate shape such as a circler shape, an elliptical shape, or a polygonal shape such as a triangular shape or a hexagonal shape. The size and the thickness of the light emitting element 1 can be appropriately selected.

Conductive Member

For the conductive members 3 provided in the step of bonding the conductive members, for example, members each having a diameter of 200 µm to 500 µm can be used. A material for the core 31 is preferably a metal having conductive property. It is preferable that a main component of the core 3a is Cu (more specifically, the content of Cu is approximately 50 weight percent or greater). In particular, it is preferable that the core 3a has a Cu content of 99% by weight or greater, or is an alloy of Cu and a metal selected from one or more of Zn, Sn, P, Ni, Au, Mo, and W, because of good thermal conductive property and electric conductive property. The diameter of the core 3a can be in a range of approximately 200 µm to 400 µm, according to the size of each of the light emitting element 1 and the pad electrodes 2.

For the material of the adhesive layer $3b_1$, a conductive material can be preferably used, and a solder is particularly preferable. Also, a conductive paste of Ag, Au, Pd or the like may be used for the material of the adhesive layer $3b_1$. For the solder, an alloy containing at least one of Au, Ag, Si, Ge, and Sn can be preferably used. Examples of other materials for the adhesive layer 3b1 include Ni, Ni—B, and Ni—P. The adhesive layer $3b_1$ is preferably disposed to cover the core 3a with an amount that can bond the pad electrodes 2 and the cores 3a when the adhesive layer $3b_1$ is heated and melt. For example, the adhesive layer $3b_1$ has a thickness in a range of approximately 30 µm to 60 µm. It is preferable that the adhesive layer $3b_1$ is disposed to cover the core 3a with a uniform thickness, which can stably bond the pad electrodes 2 and the cores 3a. A plurality of the conductive members 3 may be bonded on each of the positive and/or negative pad electrodes 2. With this arrangement, heat dissipating properties of the light emitting device can be improved. Further, heat dissipating properties of the light emitting device can be improved.

Light-shielding member

The light-shielding member 4 covers the light emitting element 1 and the conductive members 3 so that at least a portion of the main light emitting surface S is exposed, and a portion of each of the cores 3a is exposed from a surface that serves as the mounting surface of the light emitting device 100. The light-shielding member 4 insulates between the pair of the conductive members 3 that are connected to the pair of the pad electrodes 2, and is configured to reflect light emitted from the light emitting layer to a light emitting surface side of the light emitting device 100. The light-shielding member 4 preferably has a reflectivity of approximately 60% or greater, more preferably 70 to 90% or greater with respect to light emitted from the light emitting layer.

Examples of the material for the light-shielding member 4 include a base material containing a light-reflecting material. Examples of the base material include a resin, a ceramic, glass, or a composite material containing two or more of these. In particular, a resin that can be easily molded into a desired shape is preferably used. Examples of the resin include a silicone resin, a modified silicone resin, an epoxy resin, a modified epoxy resin, a phenol resin, an acrylic resin, a polycarbonate resin, a polynorbornene resin, or a hybrid resin which contains two or more of those. Examples of the light-reflective material include, titanium oxide, zinc oxide, titanium dioxide, silicon dioxide, zirconium dioxide, potassium titanate, alumina, aluminum nitride, boron nitride, mullite, niobium oxide, barium sulfate, carbon black, various rear-earth oxides (for example, yttrium oxide, gadolinium oxide, or the like). A light diffusing material or a coloring agent may be further contained in the base material.

EXAMPLE 1

A light emitting device 100 according to Example 1 of the first embodiment of the present invention and a method of manufacturing thereof will be described in detail below with reference to the drawings.

In Example 1, in a step of providing a light emitting element, a light emitting element 1 having a substantially rectangular-parallelepiped shape is provided. More specifically, the light emitting element 1 has four surfaces 1b perpendicularly connected to a first surface 1a, and one surface of the plurality of surfaces 1b connected to the first surface 1a is a main light emitting surface S, and pair of pad electrodes 2 are arranged on one surface of the plurality of surfaces 1b opposite to the main light emitting surface S. The light emitting element 1 of Example 1 can have a size of 1100 µm×200 µm in a plan view, a thickness of 200 µm, and the pad electrodes 2 each having a rectangular shape of 450 µm×100 µm in a plan view. In Example 1, the center A of each of the pad electrodes 2 is preferably arranged offset closer to the first surface 1a by 20 µm with respect to the center line X-X' in a short-side direction of a surface (i.e., the second surface 1c) on which the pad electrodes 2 are to be arranged. In Example 1, a plurality of light emitting elements 1 as described above can be arranged on a sheet 10, with the main light emitting surfaces S facing downward and at intervals of 400 µm.

Next, in a step of bonding the conductive members, conductive members 3 each having a diameter of 400 µm, which are provided in advance, are bonded on the pad electrodes 2 respectively. In Example 1, conductive members 3 in which spherical cores 3a each having a diameter of 300 µm are respectively covered by Sn—Ag—Cu having a thickness of 50 µm can be used. More specifically, the conductive members 3 are respectively arranged on each of the pad electrodes 2 by transferring, and these members are semi-bonded by heating and pressurizing (e.g., at 200° C. and 10N per one of the conductive members), after which a reflow operation is performed under an atmosphere containing 1 percent formic acid at 250° C., so that the core 3a and the pad electrodes 2 can completely bonded. In more detail, due to self-alignment effect by Sn—Ag—Cu, the conductive members 3 can be bonded on the pad electrodes 2 so that the center B of each of the cores 3a and the center A of each of the pad electrodes 2 overlap and that the cores 3a protrude from the first surface 1a. In Example 1, the conductive members 3 are bonded to the pad electrodes 2 so as to protrude from a plane that includes the first surface 1a by 70 µm.

Next, a light-shielding member 4 is formed. In Example 1, a silicone resin containing titanium oxide is provided as the light-shielding member, and the light emitting elements 1 and the conductive members 3 are covered by the light-shielding member using a transfer molding method. In Example 1, the light emitting elements 1 are arranged on the sheet 10 with the main light emitting surfaces S at a lower side. Thus, the light-shielding member 4 can be formed to expose the main light emitting surface S.

In Example 1, before performing a step of singulating, a wavelength converting layer 5 and a light-transmissive layer 6 are formed. Further, before forming a wavelength converting layer 5 and a light-transmissive layer 6, the sheet 10 is removed. In Example 1, for example, a silicone resin containing a phosphor is applied on the main light emitting surface S by using a splaying method, so that the wavelength converting layer 5 having a thickness of 30 µm can be formed. Further, the silicone resin is sprayed on the wavelength converting layer 5 to form a light-transmissive layer 6 having a thickness of 5 µm.

Next, in the step of singulating, individual light emitting devices 100 are obtained. More specifically, by dicing, a portion of each of the pair of the cores 3a protruding out from the plane that includes the first surface 1a and the light-shielding member 4 covering the protruding portions of cores 3a are cut in a direction that is substantially perpendicular to the main light emitting surface S. With this cutting, a mounting surface of the light emitting device 100 that is perpendicular to the main light emitting surface S and from which the pair of the conductive members 3 (cores 3a) are exposed. In Example 1, the conductive members 3 protruding from the plane that includes the first surface 1a and the light-shielding member covering it are cut substantially in parallel to and 50 µm spaced from the plane that includes the first surface 1a of the light emitting element 1. Further, the light-shielding member 4 is cut substantially in parallel with each of a surface opposing the first surface 1a and the third surface 1d, and thus, each light emitting device 1 can be singulated. After the step of singulating, a terminal covering film 7 may be formed so as to cover the core 3a exposed on the mounting surface.

The light emitting device 100 manufactured as described above has a size of 1700 µm×300 µm in plan view, and has a thickness of 600 µm. The cores 3a in the first embodiment each has an almost spherical shape, and the cores 3a and the pad electrodes 2a are bonded so that the center A of each original sphere of the almost spherical shape overlaps the center B of each of the pad electrodes 2. The cores 3a are exposed on a surface of the light-shielding member 4 on the first surface 1a side, toward which the pad electrodes 2 and the conductive members 3 are arranged in an offset manner, as external terminals. These exposed portions of the cores 3a and the surface of the light-shielding member 4 on the first surface 1a side make the mounting surface of the light emitting device 100. For example, an area of each of the cores 3a at a portion exposed from the mounting surface is in a range of 3 to 6% of an area of the mounting surface, which allows the light emitting device to be surely bonded to a mounting substrate. In Example 1, an area of each of the cores 3a exposed on the mounting surface can be, for example, in a range of 30 µm² to 50 µm².

Second Embodiment

Figure 6A:
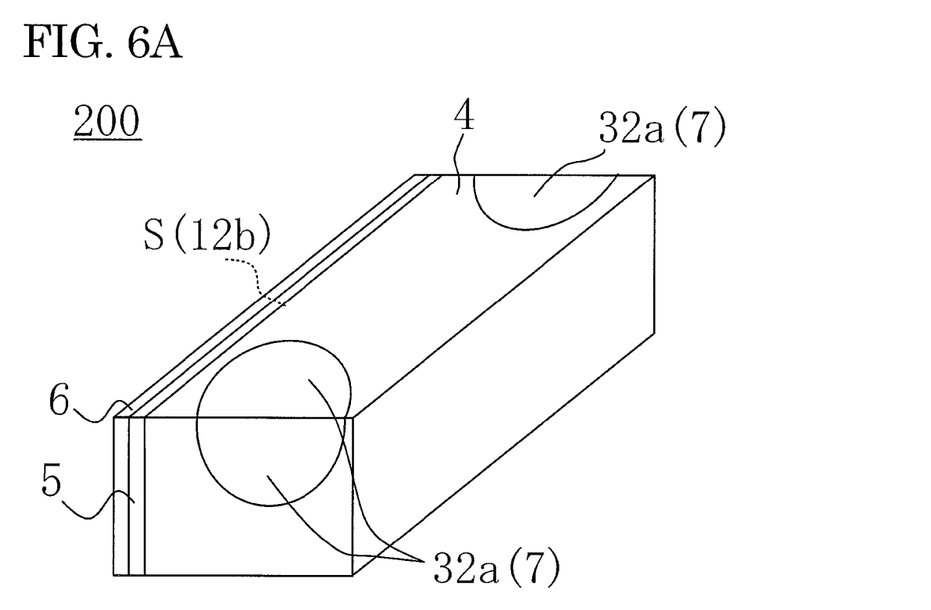
FIG. 6A is a schematic perspective view illustrating a light emitting device according to a second embodiment, in which a mounting surface side is an upper side.
Figure 6B:
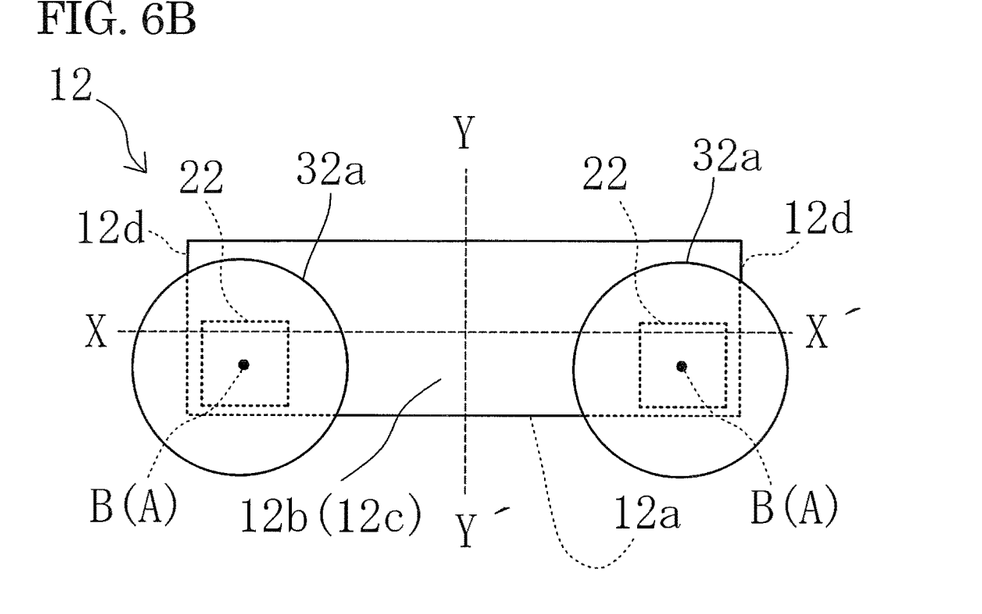
FIG. 6B is a schematic plan view illustrating a step of bonding conductive members in a method of manufacturing a light emitting device according to the second embodiment.

FIG. 6A is a schematic perspective view showing a light emitting device according to a second embodiment, in which a mounting surface side is an upper side. FIG. 6B is a schematic plan view illustrating a step of bonding conductive members in a method of manufacturing a light emitting device 200 according to the second embodiment. In the light emitting device 200 according to the second embodiment, conductive members (cores 32a) are each exposed continuously from a mounting surface of the light emitting device 200 and a lateral surface of the light emitting device 200 connected to the mounting surface and a back surface of the light emitting device 200. With such structure in which each of the core 32a is exposed continuously from two or more surfaces of the light emitting device, the light emitting device can be surely bonded to the mounting substrate, and thus it is preferable. In particular, as described in the second embodiment, with the cores 32a exposed continuously from the mounting surface and the lateral surface of the light emitting device, the light emitting device can be prevented from falling backward when the light emitting device is bonded to the mounting substrate.

As described in the second embodiment, in the case where each of the core 32a is exposed from the mounting surface and the lateral surface of the light emitting device 200, it is necessary that a pair of the cores 32a are bonded on a surface 12b (12c) on which pad electrodes 22 are arranged so that the cores 32a protrude from a plane that include a first surface 12a and so that each of the cores 32 protrude from corresponding third surfaces 12d that is closer to each of the cores 32. In this case, it is preferable that the center A of each of the pair of the pad electrode 22 is arranged on the first surface 12a side and closer to one of the third surfaces 12d that is closer to each of the pad electrodes 22. More specifically, it is preferable that the center A of each of the pair of the pad electrode 22 is arranged on the first surface 12a side with respect to the center line X-X' that connects the center of both short sides of the light emitting element 12 and that the center A of each of the pad electrodes 22 are arranged on a side of one of the third surfaces 12d that is closer to each of the pad electrodes 22 with respect to the center line Y-Y' that connects the center of both long sides of the light emitting element 12. Further, it is preferable that the center A of each of the pad electrode 22 is arranged on a side of one of the third surfaces 12d that is closer to respective one of the pad electrodes 22 with respect to a center line that connects a half point to the center of the both long sides of the light emitting element 12 divided by the center line Y-Y'. With this arrangement, self-alignment at the time of heating (i.e., bonding) allows each of the core 32a to be bonded to protrude from the plane that includes the first surface 12a and one of the third surfaces 12d that is closer to respective one of the cores 32a, so that the light emitting device 200 in which the cores 32 are exposed not only in the mounting surface but also in the lateral surface can be obtained. Other configurations and manufacturing steps can be similar to that of the first embodiment, so that detailed description thereof will be appropriately omitted.

Third Embodiment

Figure 7:
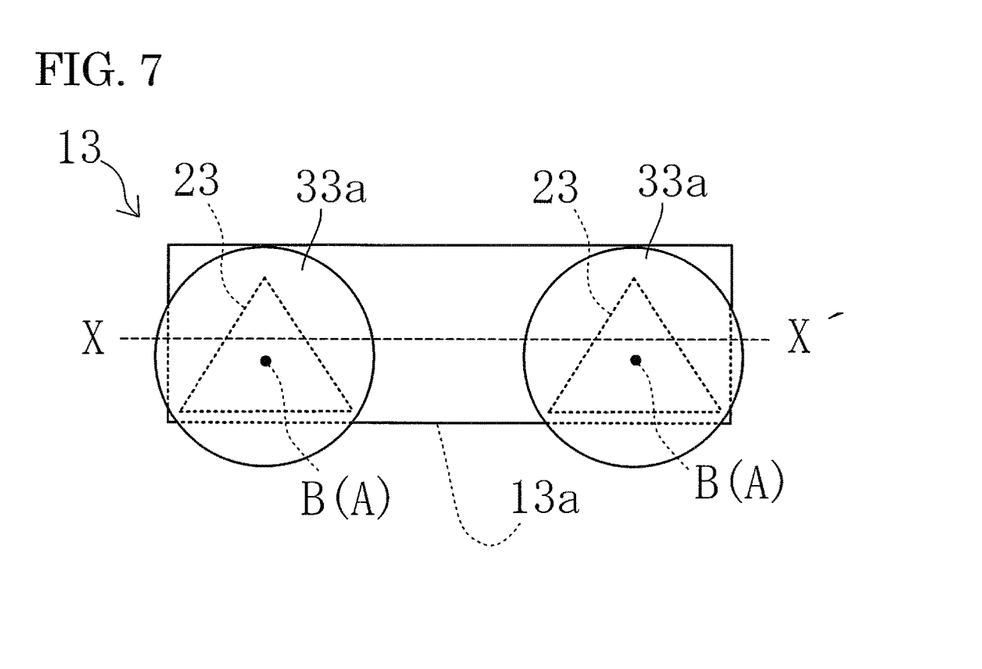
FIG. 7 is a schematic plan view illustrating a step of bonding conductive members in a method of manufacturing a light emitting device according to a third embodiment.

FIG. 7 is a schematic plan view illustrating a step of bonding conductive members in a method of manufacturing a light emitting device according to a third embodiment. In the third embodiment, pad electrodes 23 of a light emitting element 13 each has a width increasing toward a first surface 13a side in a plan view. More specifically, as illustrated in FIG. 7, each of the pad electrodes 23 has a triangular planar shape, and is arranged so that a base of the triangular shape is on the first surface 13a side. Other than such a triangular shape, the pad electrodes may each have a trapezoidal planar shape or the like. With such shapes, the center A of each of the pad electrodes 23 can be arranged on the first surface 13a side while maintaining ease of arrangement of conducive members and heat dissipation performance of the light emitting device. More specifically, the pad electrodes 23 preferably have large areas in a plan view in order to efficiently dissipate heat from the light emitting element 13 to the outside. Each of the conductive members are preferably arranged near the center line X-X', which is the center line of the width of the light emitting element 13, which facilitates stably arranging the conductive members. Accordingly, it is preferable that, while the center A of each of the pad electrodes 23 is disposed on the first surface 13a side with respect to the center line X-X' that connects the center of both short sides of the light emitting element 13, each of the pad electrodes 23 are disposed to extend to a portion near the center line X-X'. In order to realize this structure, with the shape of each of the pad electrodes 23 having a width increasing toward the first surface 13 side, the center A of the pad electrodes 23 can be offset toward the first surface 13a side. With this shape, the center of each of the pad electrodes 23 can be arranged offset on the first surface 13a side while the pad electrodes 23 are arranged to extend to the portion near the center line X-X' that connects the center of both short sides of the light emitting element 13. Such arrangement allows for obtaining a light emitting device in which the conductive members can be arranged easily and cores 33a can be easily exposed on a mounting surface.

In the third embodiment, for example, in the case of using conductive members in which the cores 33a each having a diameter of 300 μm are each covered by an adhesive layer with a thickness of 50 μm, pad electrodes 23 each having a triangular shape with a base of 200 μm and a height of 120 μm in a plan view can be arranged so that the base of each triangular shape is arranged on the first surface 13a side. In this case, the center A of each of the pad electrodes 23 can be disposed 20 μm spaced from the center line X-X' to the first surface 13a side, and a vertex of the triangular shape opposing the base can be disposed 60 μm spaced from the center line X-X' on a side of a surface opposing the first surface 13a. Other members and manufacturing steps can be similar to that of the first embodiment, so that detailed description thereof will be appropriately omitted.

While structures in each of which a pair of pad electrodes are arranged on one surface of a plurality of surfaces connected to a first surface of a light emitting element are described in the first to third embodiments, the pair of the pad electrodes may be arranged on different surfaces of the plurality of surfaces connected to the first surface. That is, the pad electrodes may be arranged on a plurality of surfaces. Also, a surface on which the pad electrodes are arranged may not be opposite side to a main light emitting surface S. These configurations will be described in detail in a fourth embodiment.

Fourth Embodiment

Figure 8A:
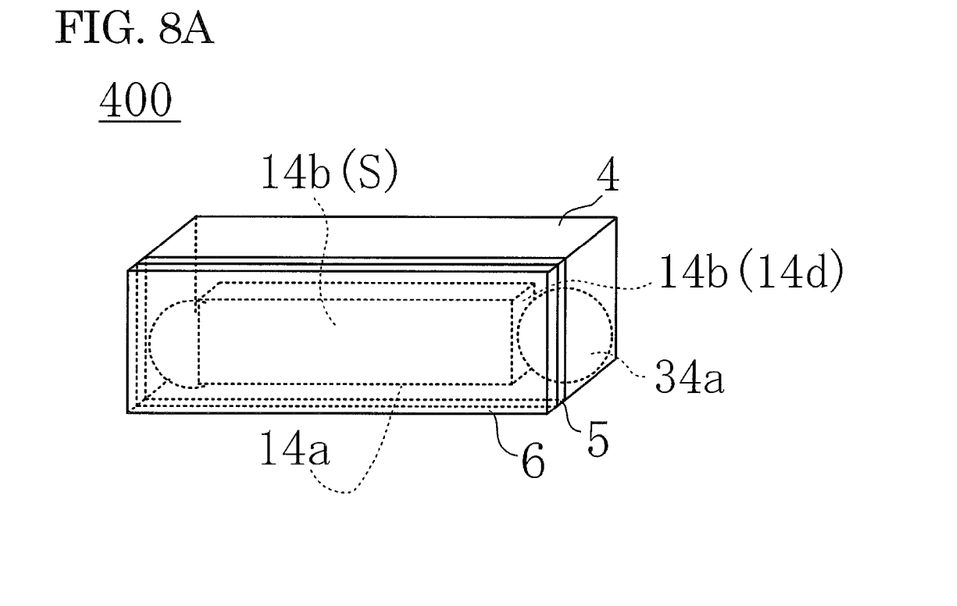
FIG. 8A is a schematic perspective view illustrating a light emitting device according to a fourth embodiment viewed from a main light-emitting surface side.
Figure 8B:
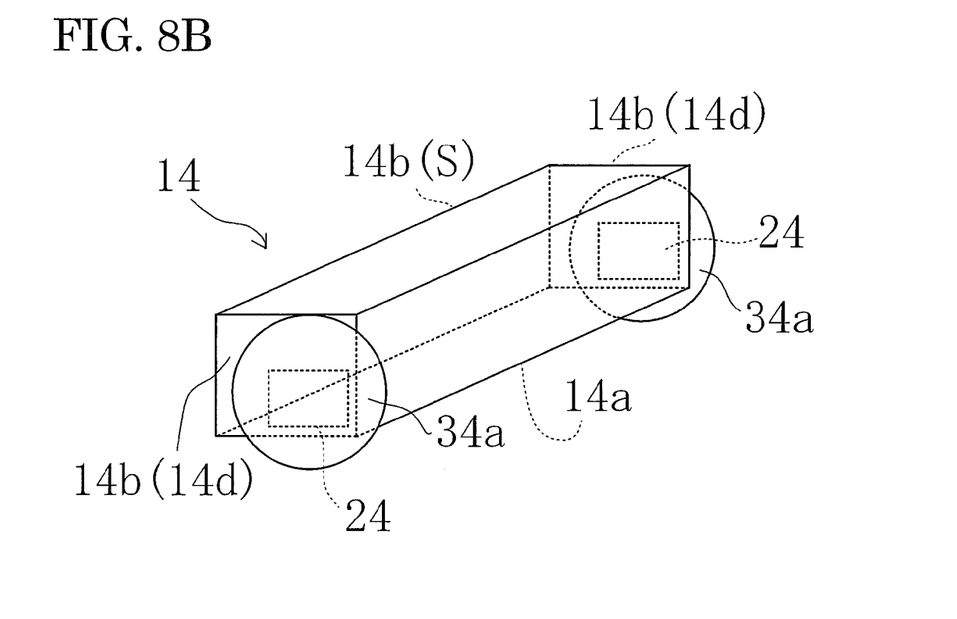
FIG. 8B is a schematic perspective view illustrating a step of bonding conductive members in a method of manufacturing a light emitting device according to the fourth embodiment.

FIG. 8A is a schematic perspective view showed a light emitting device 400 according to a fourth embodiment, viewed from a main light-emitting surface side. FIG. 8B is a schematic perspective view illustrating a step of bonding conductive members in a method of manufacturing a light emitting device 400 according to the fourth embodiment. In the fourth embodiment, the pad electrodes 24 of the light emitting element 14 are arranged on a plurality of surfaces, which is different from the configuration of the light emitting element in the first embodiment. In the fourth embodiment, any one of positive and negative pad electrodes are respectively arranged on each of third surfaces 14d, which are, of a plurality of surfaces 14b connected to the first surface 14a, two surfaces opposite to each other and connected to a main light emitting surface S and a first surface 14a. Each of the conductive members 34 are respectively bonded to each of these pad electrodes 24 so that each of the conductive members 3 protrudes from a plane that includes the first surface 1a. In the case where the pad electrodes 24 are arranged on a plurality of surfaces of the light emitting element 14, arranging the pad electrodes 24 on a surface and its opposite surface respectively allows for formation of the light emitting device 400 that can be stably mounted. Further, of the plurality of surfaces 14b connected to the first surface 14a, arranging the pad electrodes 24 and the cores 34a on opposite surfaces that interpose the main light emitting surface S allows for formation of a thin-type light emitting device 400 that is less likely to fall backward. In the case where the pad electrodes 24 are arranged on the third surfaces 14d, the cores 34a are preferably bonded so as not to protrude to a plane that includes the main light emitting surface. This arrangement allows for formation of the light emitting device 400 in which light emitted from the main light emitting surface S can hardly be absorbed by the conductive members (cores 34a). Other members and manufacturing steps can be similar to that of the first embodiment, so that detailed description thereof will be appropriately omitted.

According to certain embodiments of the present invention, a small side-view type light emitting device can be formed more easily. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
a light emitting element comprising:
a first outer surface, a second outer surface, and a main light emitting surface from which light is emitted, the first outer surface being connected to the second outer surface and the main light emitting surface;
a first pad electrode provided on the second outer surface; and
a second pad electrode provided on the second outer surface, a center of each of the first pad electrode and the second pad electrode provided closer to the first outer surface than to an other surface of the light emitting element opposite to the first outer surface;
a first conductive member including a first core and a first adhesive layer which bonds the first core and the first pad electrode;
a second conductive member including a second core and a second adhesive layer which bonds the second core and the second pad electrode; and
a light-shielding member covering the light emitting element, the first conductive member, and the second conductive member so as to expose at least a portion of the main light emitting surface and to expose each of the first core and the second core on a surface of the light emitting device adjacent to the first outer surface.

2. The light emitting device according to claim 1, wherein each of the first core and the second core has a substantially spherical shape.

3. The light emitting device according to claim 1, wherein each of the first core and the second core is exposed from a surface of the light-shielding member that overlaps with the first outer surface.

4. The light emitting device according to claim 1, wherein, when a center line connects a center of both short sides of the second outer surface such that the center line divides the second outer surface into a first area closer to the first outer surface than a second area each of the first pad electrode and the second pad electrode has a first surface area in the first area and a second surface area in the second area, the first surface area being larger than the second surface area.

5. The light emitting device according to claim 1, wherein each of the first pad electrode and the second pad electrode has a width increasing toward the first outer surface side in a plan view.

6. The light emitting device according to claim 1, wherein each of the first core and the second core has a melting point greater than a melting point of each of the first adhesive layer and the second adhesive layer.

7. The light emitting device according to claim 1, wherein each of the first adhesive layer and the second adhesive layer contains at least one of Au, Ag, Si, Ge, and Sn.

8. The light emitting device according to claim 1, wherein the second outer surface is opposite to the main light emitting surface.

9. The light emitting device according to claim 1, wherein each of the first core and the second core is exposed from two or more surfaces of the light-shielding member.

10. A light emitting device comprising:
a light emitting element comprising:
  a first outer surface, a second outer surface, a third outer surface, and a main light emitting surface from which light is emitted, the first outer surface being connected to the second outer surface, the third outer surface, and the main light emitting surface;
  a first pad electrode provided on the second outer surface or the third outer surface; and
  a second pad electrode provided on the second outer surface or the third outer surface, a center of each of the first pad electrode and the second pad electrode provided closer to the first outer surface than to an other surface of the light emitting element opposite to the first outer surface;
a first conductive member including a first core and a first adhesive layer which bonds the first core and the first pad electrode;
a second conductive member including a second core and a second adhesive layer which bonds the second core and the second pad electrode; and
a light-shielding member covering the light emitting element, the first conductive member, and the second conductive member so as to expose at least a portion of the main light emitting surface and to expose each of the first core and the second core on a surface of the light emitting device adjacent to the first outer surface.

* * * * *